United States Patent
Rana et al.

(10) Patent No.: US 9,755,632 B2
(45) Date of Patent: Sep. 5, 2017

(54) CASCODE VOLTAGE GENERATING CIRCUIT AND METHOD

(71) Applicants: STMicroelectronics International N.V., Amsterdam (NL); STMicroelectronics S.r.l., Agrate Brianza (IT)

(72) Inventors: Vikas Rana, Noida (IN); Fabio De Santis, Milan (IT)

(73) Assignees: STMICROELECTRONICS INTERNATIONAL N.V., Amsterdam (NL); STMICROELECTRONICS S.R.L., Agrate Brianza (IT)

(*) Notice: Subject to any disclaimer, the term of this patent is extended or adjusted under 35 U.S.C. 154(b) by 0 days.

(21) Appl. No.: 14/826,017

(22) Filed: Aug. 13, 2015

(65) Prior Publication Data

US 2017/0047909 A1    Feb. 16, 2017

(51) Int. Cl.
*H03L 5/00* (2006.01)
*H03K 17/10* (2006.01)

(52) U.S. Cl.
CPC .................................. *H03K 17/102* (2013.01)

(58) Field of Classification Search
CPC ....... H03K 19/00361; H03K 19/00315; H03K 17/063; H03K 5/02; H03K 5/24; H03K 5/007; H03K 5/08; H04L 25/0278; H04L 25/0269

USPC .................................. 327/108–112, 306–333
See application file for complete search history.

(56) References Cited

U.S. PATENT DOCUMENTS

| | | | |
|---|---|---|---|
| 6,788,517 B2* | 9/2004 | Riva | H03K 17/165 326/86 |
| 2016/0042794 A1* | 2/2016 | Chang | G11C 16/08 365/185.23 |

\* cited by examiner

*Primary Examiner* — Lincoln Donovan
*Assistant Examiner* — Diana J Cheng
(74) *Attorney, Agent, or Firm* — Seed Intellectual Property Law Group LLP

(57) ABSTRACT

A cascode voltage generating circuit and method are provided. The circuit includes four switching elements. In a high voltage operation mode, the first and second switching elements, respectively, couple a first intermediate voltage input node to a first intermediate voltage output node, and a second intermediate voltage input node to a second intermediate voltage output node. In a low voltage operation mode, the third switching element couples the first and second intermediate voltage input nodes to a ground reference voltage level, and the fourth switching element couples the first and second intermediate voltage output nodes to a supply voltage level.

20 Claims, 5 Drawing Sheets

CASCODE VOLTAGE GENERATING CIRCUIT AND METHOD

BACKGROUND

Technical Field

The present application relates to generating cascode voltages for biasing and in particular, but not exclusively to, circuits and methods for such voltage generation.

Description of the Related Art

Production cost is an important consideration in the design and fabrication of any integrated circuit, such as a system on chip (SoC), as well as packages having multiple chips, such as a system-in-package. One way to reduce production cost is by reducing the number of masks used, which can be achieved by minimizing the types of devices in the design. But for some chips such as Non-Volatile Memories, which are operated utilizing relatively high voltages (e.g., used for program and Erase operations), using one type of transistor is very difficult. If a transistor is not biased properly in given Safe Operating Area (SOA) limits, then reliability issues may result in the design. As such, operation of such devices within SOA limits may be facilitated using a cascode scheme, which uses intermediate voltages for cascoding.

When a single type of transistor is used in a design, then a cascode technique may be employed to protect the transistor from stress across oxide and different junctions. Cascoding is a conventional technique to bias the gate, drain/source and bulk terminals of transistors so that they can operate within a Safe Operating Area. For example, if THH is a maximum operating voltage (normally generated from on-chip charge-pump circuitry) and ⅓ THH is the SOA limit of the transistors, then voltages of ⅔ THH and ⅓THH are needed to make a two stage cascoding scheme.

Figure 1:
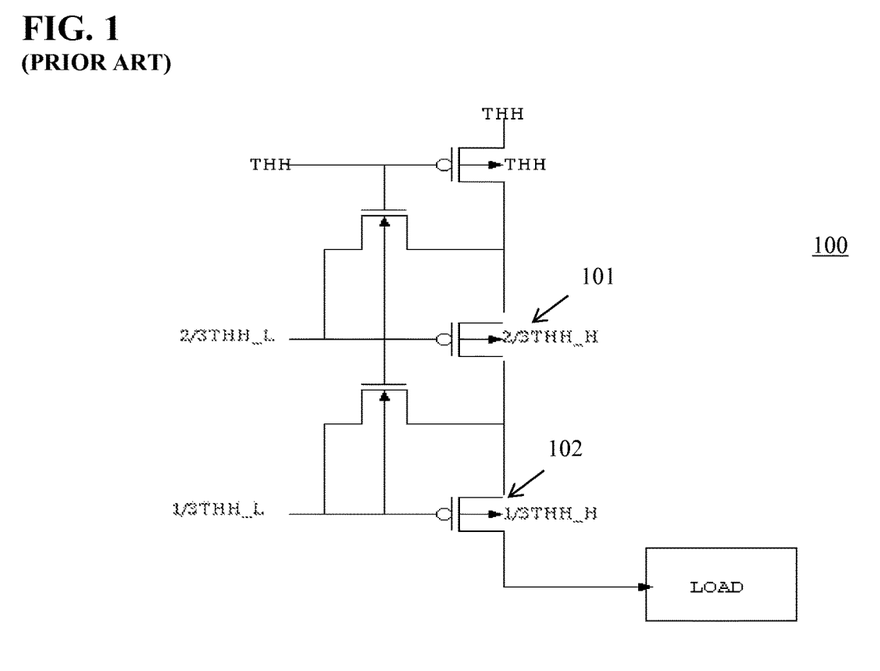
FIGS. 1 and 2 show conventional cascoding circuits, as known in the prior art.

As shown in FIG. 1, a cascoding circuit 100 may utilize two PMOS transistors 101, 102 as cascode stages, with their terminals biased with ⅔THH and ⅓THH, respectively, such that no junction of the transistors 101, 102 will be stressed more than ⅓THH and SOA limits will not be exceeded.

Figure 2:
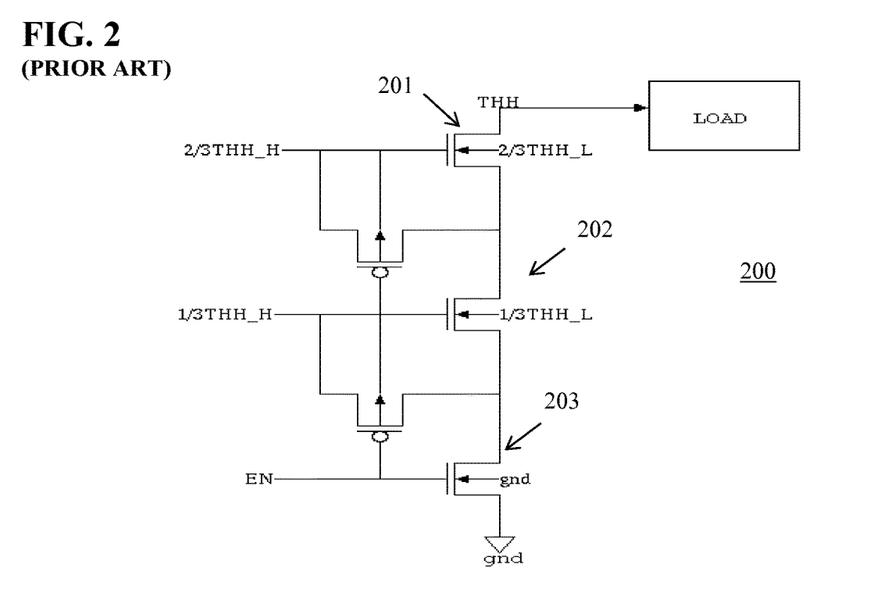

Similarly as shown in FIG. 2, a cascoding circuit 200 may include three NMOS transistors 201, 202, 203 arranged in cascade fashion and biased in such a way that no junctions of any transistor 201, 202, 203 will be stressed more than ⅓THH. Normally, these high voltages (e.g., ⅓THH and ⅔THH) are required only during specific high voltage operations (for example, program and erase operations in Non-Volatile Memory). During non-high voltage operations, these cascoding voltages should be at a normal positive supply voltage level (e.g., $V_{DD}$) or at a reference or ground (GND) level.

In order to bias the devices within a given SOA limit, intermediate voltages should be generated in such a way that they are some division of charge-pump voltage (THH) during high voltage operations, and during low voltage operations (e.g., a READ operation), the intermediate voltages should be at a normal VDD or GND level. As shown in FIGS. 1 and 2, four different voltages may be used for cascoding, and bias different terminals of the PMOS and NMOS transistors: ⅔THH_H, ⅔THH_L, ⅓THH_H and ⅓THHH_L. During high voltage operations, these voltages should be as follows: ⅔THH_H=⅔THH_L=⅔THH; and ⅓THH_H=⅓THH_L=⅓THH. In low voltage operations (e.g., when charge-pump is OFF) the voltages should be as follows: ⅔THH_H=⅓THH_H=VDD; and ⅔THH_L=⅓THH_L=GND. This is required because ⅔THH_H and ⅓THH_H signals are used to bias bulk of PMOS (i.e. NWELL) and during low voltage operation the NWELL should be biased at VDD (i.e., highest available voltage). Similarly the ⅔THH_L and ⅓THH_L signals are used to bias PWELL, which in low voltage operation should be biased at GND (i.e., lowest potential).

Figure 3:
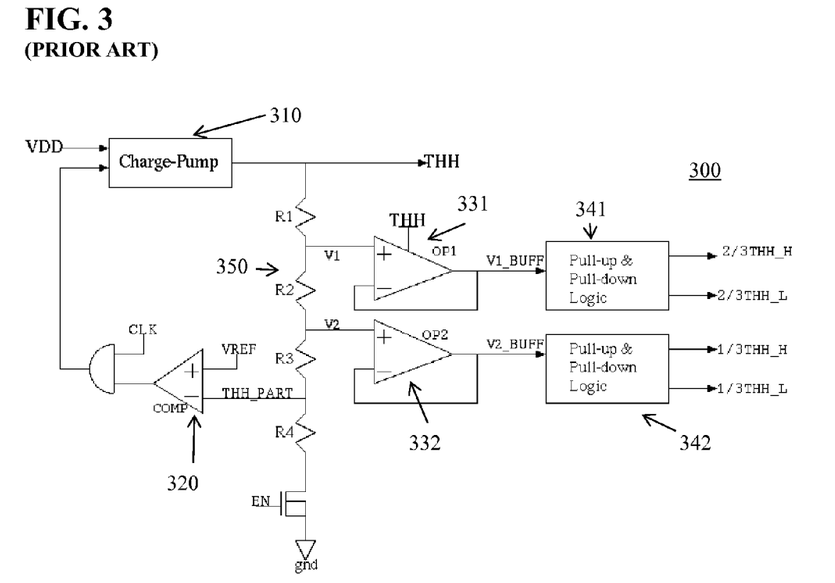
FIG. 3 shows a prior art circuit for implementing a conventional OPAMP-based cascode voltage generation technique.

FIG. 3 shows a circuit 300 for implementing a conventional OPAMP-based cascode voltage generation technique. The circuit 300 includes a charge-pump 310, resistive ladder 350 (made up of resistors R1, R2, R3 and R4), comparator 320, two OPAMPS 331, 332 configured as unity gain buffers, and pull-up and pull-down logic 341, 342. If THH is the final output of the charge-pump 310, V1 and V2 are tapped from resistive ladder 350 in such a way that V1=⅔THH and V2=⅓THH. These two voltages V1 and V2 can be buffered using the two OPAMPs 331, 332. Supply voltage for the OPAMPs 331, 332 is THH. The pull-up and pull-down logic 341, 342 is utilized so that the final signals ⅔THH_H, ⅔THH_L, ⅓THH_H and ⅓THH_L can be biased at VDD and GND levels during non-HV operations.

Figure 4:
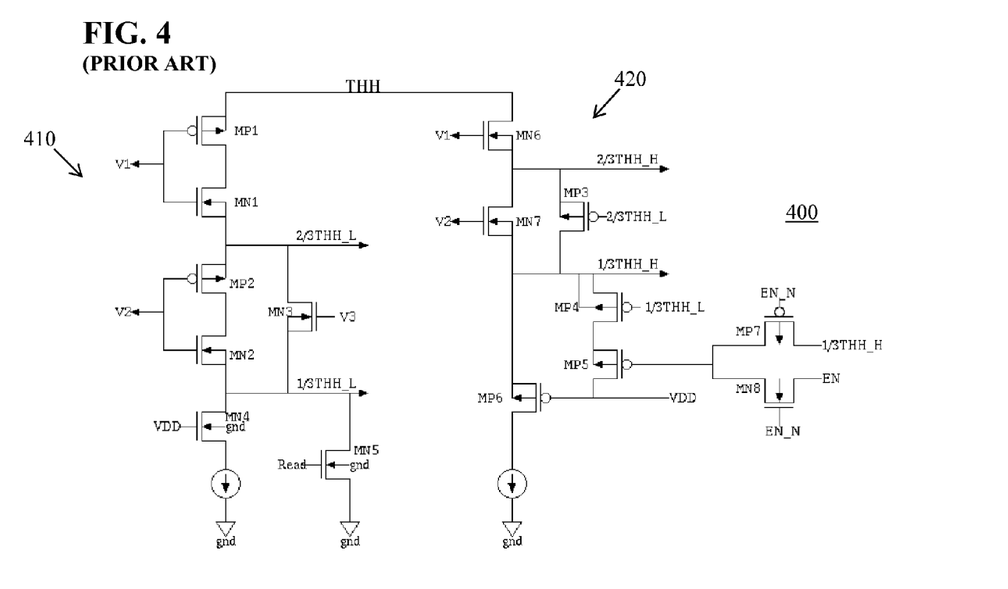
FIG. 4 shows a prior art source follower based voltage generation circuit.

FIG. 4 illustrates a circuit 400 for generating cascode voltages another way. Here, signals V1, V2 and V3 are taken from a resistive ladder used in a charge-pump. Signal V1 is used to bias the gates of transistors MP1, MN1 and MN6. V1 is taken in such a way that its voltage level is ⅔THH+Vtn. Signal V2 is used to bias the gates of transistors MP2, MN2 and MN7. V2 is taken in such a way that its voltage level during high voltage operation is ⅓THH+Vtn. Signal V3 is used to bias the gate of NMOS MN3. Signal V3 is taken in such a way that NMOS M3 is OFF during high voltage operations and during low voltage operation it is at VDD so that ⅔THH_L and ⅓THH_L can be shorted and taken to GND level. The circuit 400 includes a left branch 410 (including MP1, MN1, MP2, MN2, MN3, MN4 and MN5) and a right branch 420 (including MN6, MP3, MN7, MP4, MP5 and MP6). The left branch 410 is used to generate ⅔THH_L and ⅓THH_L voltages and the right branch 420 is used to generate ⅔THH_H and ⅓THH_H voltages. A constant current is used to bias the two branches 410, 420 during high voltage operation and during low voltage operation GND path is activated through NMOS switch MN5.

In the right branch 420, during low voltage operation ⅔THH_H and ⅓THH_H are forced to VDD level via MP3, MP4 and MP5 switches. During high voltage operation constant current is used to bias the branch.

The conventional cascode voltage generation circuits, such as those illustrated in FIGS. 3 and 4, suffer a variety of issues. In the OPAMP based cascode voltage generation circuit 300 of FIG. 3, some of these issues include:

1) Two OPAMPs are used as an analog buffer. OPAMPs will consume more current which is to be provided by the charge-pump. Thus, more power will be consumed, and in order to provide this current more area will be used in the charge-pump.
2) OPAMPs are working at high voltage THH (generated from charge-pump), so conventional OPAMPs cannot be used. Thus, there should be some cascoded structure inside the OPAMPs to protect the transistors.
3) In order to force the ⅔THH_H=⅓THH_H=VDD and ⅔THH_L=⅓THH_L=GND complex pull-up and pull-down logic is employed in prior art designs, which uses extra area and consumers more power.

Some of the problems faced in the OPAMP based voltage generation circuit 300 of FIG. 3 may be overcome in the source follower based voltage generator circuit 400 shown in FIG. 4. However, that circuit also has certain problems, including the following:

1) Due to the different capacitive loads on each branch, during the ramp-up of charge-pump the ⅔THH_H signal has a different ramp rate than the ⅔THH_L signal, and similarly the ⅓THH_H signal has a different ramp rate than the ⅓THH_L signal. As these signals are used to bias the different terminals of transistors, there can be forward biasing of Bulk to Drain or Bulk to source junctions. Due to Bulk junction forward biasing, there can be a risk of latch-up in the chip.
2) Further, current is consumed by each of the two branches which are supported by the charge-pump, which results in more area and higher power consumption.

BRIEF SUMMARY

Some of the key considerations and challenges for generating the intermediate voltages used for cascoding and Bulk biasing are as follows:
1) the circuit used to generate the voltages should be area effective;
2) current consumption should be very small, because whatever current is consumed by the circuit is to be supported by an on-chip charge-pump;
3) even if there are different capacitive and current loads on different voltages (i.e. ⅔THH_H & ⅔THH_L; ⅓THH_H & ⅓THH_L), they should ramp with the same ramp rate. If the ramp rate is different, forward biasing of bulks can result (as is the case with the circuits 100 and 200 shown in FIGS. 1 and 2, respectively) which can create a latch-up prone situation;
4) the final voltage level of the cascode voltages should be related and proportional to THH voltage, which is the output of charge-pump. For example, if THH increases in any condition then accordingly the rest of the voltages should be increased by the same proportion. And, if THH decreases in any condition then all voltages should decrease in same proportion; and
5) during low voltage operations when the charge-pump is not enabled, then: THH=⅔THH_H=⅓THH_H=$V_{DD}$ to bias NWELL at high voltages, and ⅔THH_L=⅓THH_L=GND, to bias PWELL at low voltages.

At least some embodiments of the present disclosure provide cascode voltage generating circuits and methods to address the above, as well as other, considerations and challenges.

According to a first aspect, there is provided a cascode voltage generating circuit, comprising: a first switching element positioned to selectively couple a first intermediate voltage input node to a first intermediate voltage output node; a second switching element positioned to selectively couple a second intermediate voltage input node to a second intermediate voltage output node; a third switching element positioned to selectively couple the first and second intermediate voltage input nodes to a ground reference voltage; a fourth switching element positioned to selectively couple the first and second intermediate voltage output nodes to a supply voltage; and a controller. The controller is configured to, in a high voltage operation mode: turn on the first and second switching elements, and turn off the third and fourth switching elements, thereby driving the first intermediate voltage output node to a voltage level at the first intermediate voltage input node, and driving the second intermediate voltage output node to a voltage level at the second intermediate voltage input node. Further, the controller is configured to, in a low voltage operation mode: turn off the first and second switching elements, and turn on the third and fourth switching elements, thereby driving the first and second intermediate voltage input nodes to a ground reference voltage level, and driving the first and second intermediate voltage output nodes to a supply voltage.

The first, second, third and fourth switching elements may comprise first, second, third and fourth transistors, respectively.

The controller may provide a read signal to a gate terminal of the third transistor in the low voltage operation mode and thereby cause the third transistor to turn on, thereby driving the first and second intermediate voltage input nodes to the ground reference voltage level.

The controller may provide an enable signal to a gate terminal of the fourth transistor in the low voltage operation mode and thereby cause the fourth transistor to turn on, thereby driving the first and second intermediate voltage output nodes to the supply voltage level.

A voltage divider circuit may be included, and the voltage divider circuit may have first and second output nodes that are electrically coupled to the first and second intermediate voltage input nodes. The voltage divider circuit may be supplied with a charge-pump output voltage.

In the high voltage operation mode, the voltage level at the first intermediate voltage output node may be substantially equal to ⅔THH, and the voltage level at the second intermediate voltage node may be substantially equal to ⅓THH, where THH is the charge-pump output voltage.

During a transition from the low voltage operation mode to the high voltage operation mode, the voltage level at the first intermediate voltage input node may have a same ramp rate as the voltage level at the first intermediate voltage output node, and the voltage level at the second intermediate voltage input node may have a same ramp rate as the voltage level at the second intermediate voltage output node.

According to a second aspect, there is provided a method comprising: providing a first switching element positioned to selectively couple a first intermediate voltage input node to a first intermediate voltage output node; providing a second switching element positioned to selectively couple a second intermediate voltage input node to a second intermediate voltage output node; providing a third switching element positioned to selectively couple the first and second intermediate voltage input nodes to a ground reference voltage; and providing a fourth switching element positioned to selectively couple the first and second intermediate voltage output nodes to a supply voltage.

The method may further comprise, during a high voltage operation mode: providing control signals to turn on the first and second switching elements; and providing control signals to turn off the third and fourth switching elements, thereby driving the first intermediate voltage output node to a voltage level at the first intermediate voltage input node, and driving the second intermediate voltage output node to a voltage level at the second intermediate voltage input node.

The method may further comprise, during a low voltage operation mode: providing control signals to turn off the first and second switching elements; and providing control signals to turn on the third and fourth switching elements, thereby driving the first and second intermediate voltage input nodes to a ground reference voltage level, and driving the first and second intermediate voltage output nodes to a supply voltage level.

The first, second, third and fourth switching elements may comprise first, second, third and fourth transistors, respectively.

A gate terminal of the third transistor may be configured to receive a read signal in a low voltage operation mode, and the presence of the read signal at the gate terminal of the third transistor may cause the third transistor to turn on, thereby driving the first and second intermediate voltage input nodes to the ground reference voltage level.

A gate terminal of the fourth transistor may be configured to receive an enable signal in the low voltage operation mode, and the presence of the enable signal at the gate terminal of the fourth transistor may cause the fourth transistor to turn on, thereby driving the first and second intermediate voltage output nodes to the supply voltage level.

The first and second intermediate voltage input nodes may be electrically coupled to first and second output nodes, respectively, of a charge-pump voltage divider circuit.

In the high voltage operation mode, the voltage level at the first intermediate voltage output node may be substantially equal to ⅔THH, and the voltage level at the second intermediate voltage node may be substantially equal to ⅓THH, where THH is the charge-pump output voltage.

According to a third aspect, there is provided a circuit comprising: a charge-pump configured to provide an output voltage; a voltage dividing circuit configured receive the charge-pump output voltage and output first and second divided output voltages; and a cascode voltage generating circuit configured to receive the first and second divided output voltages. The cascode voltage generating circuit comprises: a first switching element positioned to selectively couple a first intermediate voltage input node to a first intermediate voltage output node; a second switching element positioned to selectively couple a second intermediate voltage input node to a second intermediate voltage output node; a third switching element positioned to selectively couple the first and second intermediate voltage input nodes to a ground reference voltage; a fourth switching element positioned to selectively couple the first and second intermediate voltage output nodes to a supply voltage; and a controller.

The controller may be configured to, in a high voltage operation mode: turn on the first and second switching elements, and turn off the third and fourth switching elements, thereby driving the first intermediate voltage output node to a voltage level at the first intermediate voltage input node, and driving the second intermediate voltage output node to a voltage level at the second intermediate voltage input node, and in a low voltage operation mode: turn off the first and second switching elements, and turn on the third and fourth switching elements, thereby driving the first and second intermediate voltage input nodes to a ground reference voltage level, and driving the first and second intermediate voltage output nodes to a supply voltage level.

The first, second, third and fourth switching elements may comprise first, second, third and fourth transistors, respectively.

The controller may provide a read signal to a gate terminal of the third transistor in the low voltage operation mode and thereby cause the third transistor to turn on, thereby driving the first and second intermediate voltage input nodes to the ground reference voltage level.

The controller may provide an enable signal to a gate terminal of the fourth transistor in the low voltage operation mode and thereby cause the fourth transistor to turn on, thereby driving the first and second intermediate voltage output nodes to the supply voltage level.

In the high voltage operation mode, the voltage level at the first intermediate voltage output node may be substantially equal to ⅔THH, and the voltage level at the second intermediate voltage node may be substantially equal to ⅓THH, where THH is the charge-pump output voltage.

BRIEF DESCRIPTION OF THE SEVERAL VIEWS OF THE DRAWINGS

Embodiments of the present application will now be described with reference to the following figures in which.

DETAILED DESCRIPTION

Figure 5:
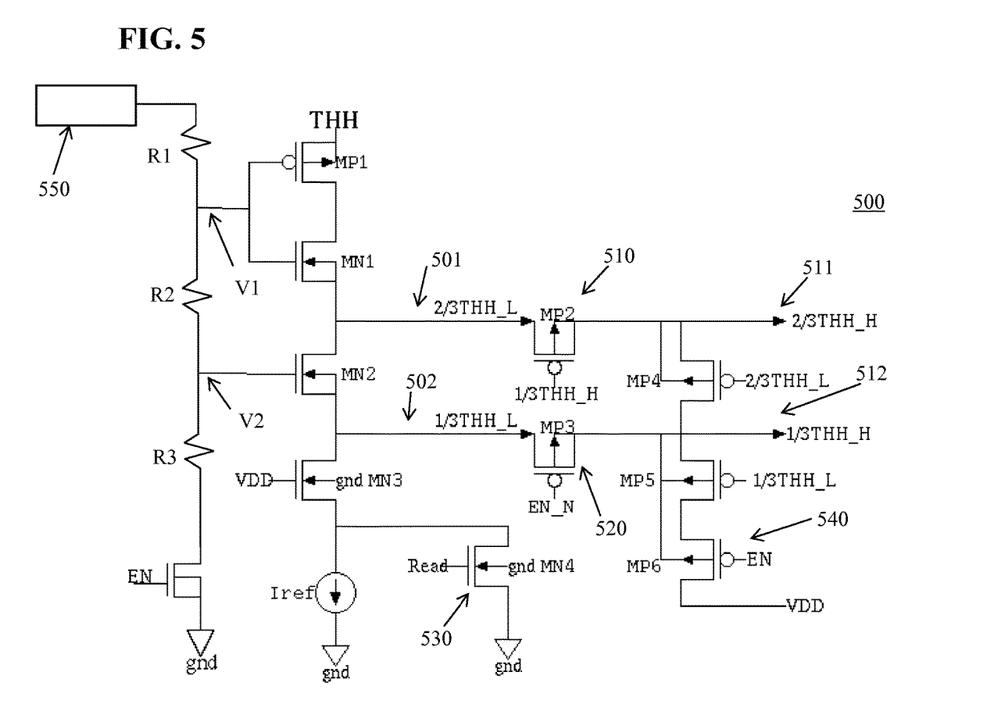
FIG. 5 is a circuit diagram of a cascode voltage generating circuit according to one embodiment.

FIG. 5 shows a cascode voltage generating circuit 500 for generating cascode voltages for biasing according to one inventive embodiment. Some of the advantages provided by the embodiment shown in FIG. 5 include decreasing the static current consumption, decreasing the total area of circuit, and providing a same ramp rate for different output signals.

The circuit 500 of FIG. 5 is a source follower based voltage generation circuit. THH is the final charge-pump output voltage. V1 and V2 are voltages which may be taken from, for example, a resistive ladder (including resistors R1, R2 and R3) supplied from the charge-pump 550. Here, V1=⅔THH+Vtn and V2=⅓THH+Vtn, where Vtn is a threshold voltage for the transistors. V1 is used to bias the gate of transistors MP1 and MN1. V2 is used to bias the gate of NMOS MN2.

The cascode voltage generating circuit 500 includes a first switching element 510 (shown as transistor MP2) positioned to selectively couple a first intermediate voltage input node 501 (⅔THH_L) to a first intermediate voltage output node 511 (⅔THH_H). A second switching element 520 (shown as transistor MP3) is positioned to selectively couple a second intermediate voltage input node 502 (⅓THH_L) to a second intermediate voltage output node 512 (⅓THH_H). A third switching element 530 (shown as transistor MN4) is positioned to selectively couple the first and second intermediate voltage input nodes 501, 502 to a ground reference voltage. And, a fourth switching element 540 (shown as transistor MP6) is positioned to selectively couple the first and second intermediate voltage output nodes 511, 512 to a supply voltage (VDD), which may be a positive supply voltage supplied to the chip. A controller (not shown) may control the switching of the first, second, third and/or fourth switching elements, for example, by provide the read signal, enable signals EN and EN_N.

During a high voltage operation, the "Read" signal, which may be provided from the controller, is low (i.e. logic "0") and the GND path is disconnected, because the third switching element 530 (e.g., NMOS MN4) is switched OFF. At that time, a constant current path is activated (i.e., current from current source Iref through transistors MN1, MN2 and MN3) which will force the second intermediate voltage input node 502 (⅓THH_L) signal to V2−Vtn voltage level and the first intermediate voltage input node 501 (⅔THH_L) signal to V1−Vtn voltage level.

Further, during high voltage operations, the enable signal (EN), which may be provided by the controller, is high (e.g., equal to VDD level), thereby switching OFF the fourth switching element 540 (which may be or include one or more of PMOS transistors MP4, MP5 and MP6). The supply voltage (VDD) path to the first intermediate voltage output node 511 (⅔THH_H) and the second intermediate voltage output node 512 (⅓THH_H) is thus disconnected. The second switching element 520 (e.g., PMOS MP3) is turned ON by the inverted enable signal (EN_N), which may be provided from the controller, and thus shorts the signal at the second intermediate voltage input node 502 (⅓THH_L) to the first intermediate voltage output node 512 (⅓THH_H). Similarly, the first switching element 510 (e.g., PMOS MP2) is turned ON and shorts the signal at the first intermediate voltage input node 501 (⅔THH_L) to the first intermediate voltage output node 511 (⅔THH_H). By doing so, the ramp rate of the voltages at the first intermediate voltage input and output nodes 501, 511 (e.g., voltages of signals ⅔THH_L and ⅔THH_H, respectively) are the same, and the ramp rate of the voltages at the second intermediate voltage input and output nodes 502, 512 (e.g., voltages of signals ⅓THH_L and ⅓THH_H, respectively) are the same. Thus, even if these signals see different capacitive loads, their ramp rates will be same.

During low voltage operations, the charge-pump is disabled and THH is forced to VDD. At that time, the Read signal, which may be provided by the controller, is high (i.e. logic "1"), which turns ON the third switching element 530 and forces the first and second intermediate voltage input nodes 501, 502 (i.e., ⅔THH_L and ⅓THH_L, respectively) to GND. But, as the first and second switching elements 510, 520 (e.g., PMOS transistors MP2 and MP3, respectively) are also switched OFF (because the controller causes the enable (EN) signal to go low and the inverted enable signal (EN_N) to go high), the first intermediate voltage output node 511 (⅔THH_H) is disconnected from the first intermediate voltage input node 501 (⅔THH_L), and the second intermediate voltage output node 512 (⅓THH_H) is disconnected from the second intermediate voltage input node 502 (⅓THH_L).

Simultaneously, the supply voltage (VDD) path to the first and second intermediate voltage output nodes 511, 512 (⅔THH_H and ⅓THH_H, respectively) is enabled via the fourth switching element 540 (which may include, for example, PMOS transistors MP4, MP5 and MP6), which forces the first and second intermediate voltage output nodes 511, 512 to VDD. Also, as THH is at VDD (as are V1 and V2, via the resistive ladder), PMOS MP1 will be switched OFF and there will not be any static consumption during low voltage operation.

Figure 6:
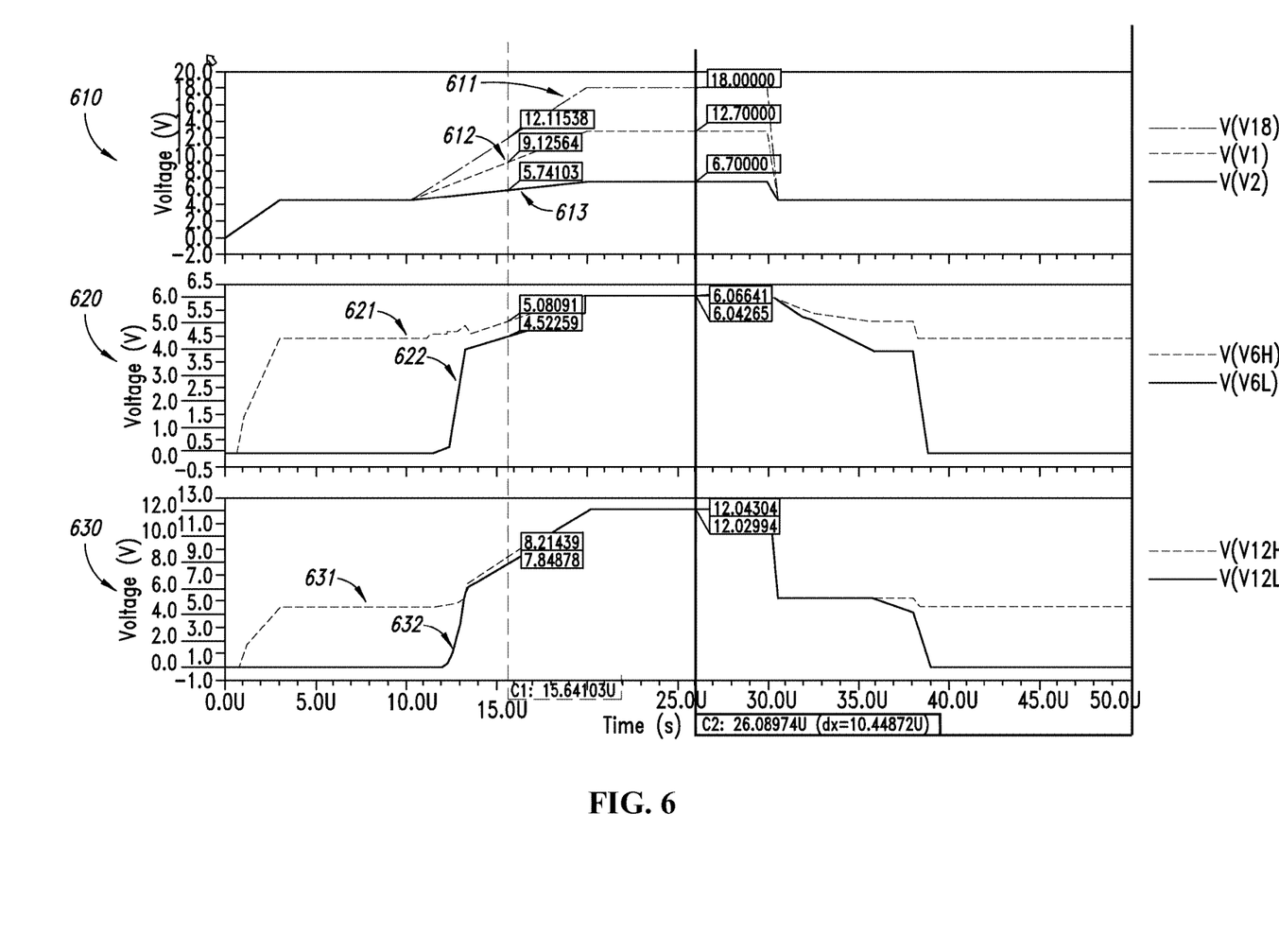
FIGS. 6 and 7 are signal diagrams showing a comparison of the behavior of an embodiment with the prior art source follower voltage generator shown in FIG. 4.

Simulation Results:

All circuits have been simulated for 110 nm technology. FIG. 6 shows the simulation results of the prior art circuit of FIG. 4. The upper portion 610 of FIG. 6 shows the voltage levels of signals THH 611, V1 612, and V2 613 during simulation. The middle portion 620 shows the voltage levels of signals ⅓THH_H 621 and ⅓THH_L 622 during simulation. And, the lower portion 630 shows the voltage levels of signals ⅔THH_H 631 and ⅔THH_L 632 during simulation. At about 10 μs, the circuit begins to ramp-up into a high voltage operation mode. It is evident from the simulation results that there is difference in ramp rate of ⅔THH_H 631 with respect to ⅔THH_L 632, and similarly there is a difference in ramp rate of ⅓THH_H 621 with respect to ⅓THH_L 622. This is a problematic situation and is latch-up prone situation.

Figure 7:
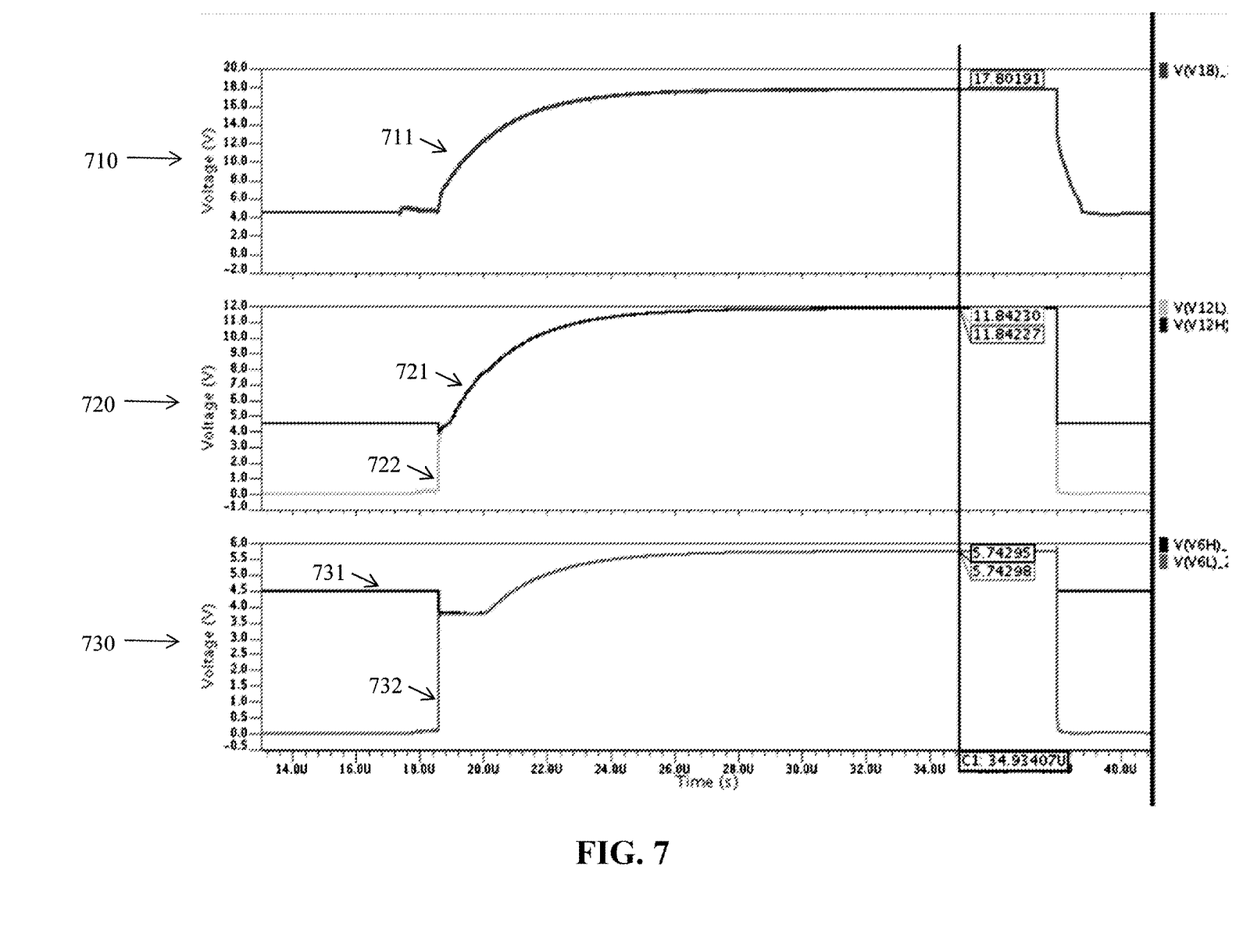

FIG. 7 shows the simulation results of the embodiment illustrated in FIG. 5. The upper portion 710 of FIG. 7 shows the voltage level of the signal THH 711, which is at VDD (about 4.5V in the example of FIG. 7) during low voltage operations and the charge-pump output voltage level of 17.8V during high voltage operations. The middle portion 720 shows the voltage levels of signals ⅔THH_H 721 and ⅔THH_L 722 during simulation. The lower portion 730 shows the voltage levels of signals ⅓THH_H 731 and ⅓THH_L 732 during simulation. As can be seen from the simulation results in the middle portion 720 of FIG. 7, the ramp rates of ⅔THH_H 721 and ⅔THH_L 722 are the same. Similarly, as seen in the lower portion 730, the ramp rates of ⅓THH_H 731 and ⅓THH_L 732 are the same.

Embodiments of circuits provided herein thus use less area and consume less power than the conventional cascode voltage generation circuits. Further, as the ramp rates for different signals are the same (i.e. the ramp rate for ⅓THH_H is the same as ⅓THH_L, and ⅔THH_H is the same as ⅔THH_L), the risk of Bulk forward biasing is eliminated and hence the probability of latch-up during ramp-up is reduced or eliminated.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A cascode voltage generating circuit, comprising:
   a first switching element positioned to selectively couple a first intermediate voltage input node to a first intermediate voltage output node;
   a second switching element positioned to selectively couple a second intermediate voltage input node to a second intermediate voltage output node;
   a third switching element positioned to selectively couple the first and second intermediate voltage input nodes to a ground reference voltage;
   a fourth switching element positioned to selectively couple the first and second intermediate voltage output nodes to a supply voltage, and configured to selectively provide the supply voltage to the first and second intermediate voltage output nodes via the fourth switching element;
   a fifth switching element having first and second conduction terminals respectively coupled to the first and second intermediate voltage input nodes; and a controller being configured to, in a high voltage operation mode:
turn on the first and second switching elements, and turn off the third and fourth switching elements, thereby driving the first intermediate voltage output node to a voltage level at the first intermediate voltage input node, and driving the second intermediate voltage output node to a voltage level at the second intermediate voltage input node, and in a low voltage operation mode:
turn off the first and second switching elements, and turn on the third and fourth switching elements, thereby driving the first and second intermediate voltage input nodes to a ground reference voltage level, and driving the first and second intermediate voltage output nodes to the supply voltage.

2. The circuit of claim 1, wherein the first, second, third, fourth and fifth switching elements comprise first, second, third, fourth and fifth transistors, respectively.

3. The circuit of claim 2, wherein the controller is configured to provide a read signal to a gate terminal of the third transistor in the low voltage operation mode and thereby cause the third transistor to turn on, thereby driving the first and second intermediate voltage input nodes to the ground reference voltage level.

4. The circuit of claim 3, wherein the controller is configured to provide an enable signal to a gate terminal of the fourth transistor in the low voltage operation mode and thereby cause the fourth transistor to turn on, thereby driving the first and second intermediate voltage output nodes to the supply voltage level.

5. The circuit of claim 1, further comprising a voltage divider circuit having first and second output nodes electrically coupled to the first and second intermediate voltage input nodes, respectively, wherein the voltage divider circuit is supplied with a charge-pump output voltage.

6. The circuit of claim 5, wherein in the high voltage operation mode, the voltage level at the first intermediate voltage output node is substantially equal to ⅔THH, and the voltage level at the second intermediate output voltage node is substantially equal to ⅓THH, where THH is the charge-pump output voltage.

7. The circuit of claim 1, wherein during a transition from the low voltage operation mode to the high voltage operation mode, the voltage level at the first intermediate voltage input node has a same ramp rate as the voltage level at the first intermediate voltage output node, and the voltage level at the second intermediate voltage input node has a same ramp rate as the voltage level at the second intermediate voltage output node.

8. A method, comprising:
providing a first switching element positioned to selectively couple a first intermediate voltage input node to a first intermediate voltage output node;
providing a second switching element positioned to selectively couple a second intermediate voltage input node to a second intermediate voltage output node;
providing a third switching element positioned to selectively couple the first and second intermediate voltage input nodes to a ground reference voltage;
providing a fourth switching element positioned to selectively couple the first and second intermediate voltage output nodes to a supply voltage, and configured to selectively provide the supply voltage to the first and second intermediate voltage output nodes via the fourth switching element; and providing a fifth switching element having first and second conduction terminals respectively coupled to the first and second intermediate voltage input nodes.

9. The method of claim 8, further comprising, during a high voltage operation mode:
providing control signals to turn on the first and second switching elements; and
providing control signals to turn off the third and fourth switching elements,
thereby driving the first intermediate voltage output node to a voltage level at the first intermediate voltage input node, and driving the second intermediate voltage output node to a voltage level at the second intermediate voltage input node.

10. The method of claim 8, further comprising, during a low voltage operation mode:
providing control signals to turn off the first and second switching elements; and
providing control signals to turn on the third and fourth switching elements,
thereby driving the first and second intermediate voltage input nodes to a ground reference voltage level, and driving the first and second intermediate voltage output nodes to a supply voltage level.

11. The method of claim 8, wherein the first, second, third, fourth and fifth switching elements comprise first, second, third, fourth and fifth transistors, respectively.

12. The method of claim 11, wherein a gate terminal of the third transistor is configured to receive a read signal in a low voltage operation mode, wherein the presence of the read signal at the gate terminal of the third transistor causes the third transistor to turn on, thereby driving the first and second intermediate voltage input nodes to the ground reference voltage level.

13. The method of claim 12, wherein a gate terminal of the fourth transistor is configured to receive an enable signal in the low voltage operation mode, wherein the presence of the enable signal at the gate terminal of the fourth transistor causes the fourth transistor to turn on, thereby driving the first and second intermediate voltage output nodes to the supply voltage level.

14. The method of claim 8, wherein the first and second intermediate voltage input nodes are electrically coupled to first and second output nodes, respectively, of a charge-pump voltage divider circuit.

15. The method of claim 14, wherein in the high voltage operation mode, the voltage level at the first intermediate voltage output node is substantially equal to ⅔THH, and the voltage level at the second intermediate voltage node is substantially equal to ⅓THH, where THH is the charge-pump output voltage.

16. A circuit comprising:
a charge-pump configured to provide an output voltage;
a voltage dividing circuit configured receive the charge-pump output voltage and output first and second divided output voltages; and
a cascode voltage generating circuit configured to receive the first and second divided output voltages, the cascode voltage generating circuit including:
a first switching element positioned to selectively couple a first intermediate voltage input node to a first intermediate voltage output node;
a second switching element positioned to selectively couple a second intermediate voltage input node to a second intermediate voltage output node;

a third switching element positioned to selectively couple the first and second intermediate voltage input nodes to a ground reference voltage;

a fourth switching element positioned to selectively couple the first and second intermediate voltage output nodes to a supply voltage, and configured to selectively provide the supply voltage to the first and second intermediate voltage output nodes via the fourth switching element;

a fifth switching element having first and second conduction terminals respectively coupled to the first and second intermediate voltage input nodes; and a controller being configured to, in a high voltage operation mode:

turn on the first and second switching elements, and turn off the third and fourth switching elements, thereby driving the first intermediate voltage output node to a voltage level at the first intermediate voltage input node, and driving the second intermediate voltage output node to a voltage level at the second intermediate voltage input node, and in a low voltage operation mode:

turn off the first and second switching elements, and turn on the third and fourth switching elements, thereby driving the first and second intermediate voltage input nodes to a ground reference voltage level, and driving the first and second intermediate voltage output nodes to the supply voltage.

17. The circuit of claim 16, wherein the first, second, third, fourth and fifth switching elements comprise first, second, third, fourth and fifth transistors, respectively.

18. The circuit of claim 17, wherein the controller is configured to provide a read signal to a gate terminal of the third transistor in the low voltage operation mode and thereby cause the third transistor to turn on, thereby driving the first and second intermediate voltage input nodes to the ground reference voltage level.

19. The circuit of claim 18, wherein the controller is configured to provide an enable signal to a gate terminal of the fourth transistor in the low voltage operation mode and thereby cause the fourth transistor to turn on, thereby driving the first and second intermediate voltage output nodes to the supply voltage level.

20. The circuit of claim 16, wherein in the high voltage operation mode, the voltage level at the first intermediate voltage output node is substantially equal to $\frac{2}{3}$THH, and the voltage level at the second intermediate voltage node is substantially equal to $\frac{1}{3}$THH, where THH is the charge-pump output voltage.

* * * * *